(12) United States Patent
Zhuang

(10) Patent No.: US 7,791,523 B2
(45) Date of Patent: Sep. 7, 2010

(54) TWO-STEP SUB-RANGING ANALOG-TO-DIGITAL CONVERTER AND METHOD FOR PERFORMING TWO-STEP SUB-RANGING IN AN ANALOG-TO-DIGITAL CONVERTER

(75) Inventor: Zailong Zhuang, Scarborough, ME (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 12/259,344

(22) Filed: Oct. 28, 2008

(65) Prior Publication Data

US 2010/0103010 A1 Apr. 29, 2010

(51) Int. Cl.
*H03M 1/12* (2006.01)
(52) U.S. Cl. ............... 341/156; 341/155; 341/160; 341/169; 341/164
(58) Field of Classification Search ............ 341/155, 341/156, 160, 164, 169
See application file for complete search history.

(56) References Cited

U.S. PATENT DOCUMENTS

| 5,138,319 A * | 8/1992 | Tesch ............ 341/156 |
| 7,088,281 B1 * | 8/2006 | Menkus ........... 341/156 |
| 7,215,274 B2 * | 5/2007 | Liu ............... 341/156 |
| 7,626,531 B2 * | 12/2009 | Bailey ............ 341/156 |

OTHER PUBLICATIONS

Noriyuki Fukushima, et al., A CMOS 8-bit 20MHz Two-step Parallel A/D Converter with 95nW Power Comsumption, IEEE, 1988, pp. 238-239, FAM 17.1, IEEE.
Brian P. Brandt, et al., A 75-mW, 10-b, 20-MSPS CMOS Subranging ADC with 9.5 Effective Bits at Nyquist, IEEE Journal of Solid State Circuits, Dec. 1999, pp. 1788-1795, vol. 34, No. 12, IEEE.
Tatsuji Matsuura, et al., An 8b 20MHz CMOS Half-Flash A/D Converter, IEEE International Solid State Circuits Conference, Digest of Technical Papers, Feb. 19, 1988, pp. 220-221, 376, ISSCC 88, IEEE.
P. Setty, et al., A 5.75b 350MSample/s or 6.75b 150MSample/s Reconfigurable Flash ACD for a PRML Read Channel, IEEE International Solid State Circuits Conference, Digest of Technical Papers, Feb. 6, 1998, pp. 148-149, 428, ISSCC98, IEEE.

* cited by examiner

*Primary Examiner*—Jean B Jeanglaude
(74) *Attorney, Agent, or Firm*—Daniel J. Santos; John M. Harman

(57) ABSTRACT

A two-step ADC is provided that achieves significant improvements in the settling time window available for CDAC conversion, FADC sub-ranging and FADC conversion without increasing the amount of chip area or power that are consumed by the ADC. The ADC uses interleaved sampler/buffer circuits to sample the incoming analog signal on different phases of the clock signal. MUXes provide the samples obtained by the sampler/buffer circuits to the CADC and FADC circuits in ping pong fashion in such a way that the CADC and FADC circuits are converting during every clock period. In addition, these improvements are achieved without increasing the number of potential sources of bit decision mismatches in the two-step sub-ranging ADC.

22 Claims, 8 Drawing Sheets

TWO-STEP SUB-RANGING ANALOG-TO-DIGITAL CONVERTER AND METHOD FOR PERFORMING TWO-STEP SUB-RANGING IN AN ANALOG-TO-DIGITAL CONVERTER

TECHNICAL FIELD OF THE INVENTION

The invention relates to analog-to-digital converters (ADCs), and more particularly, to a two-step sub-ranging ADC.

BACKGROUND OF THE INVENTION

ADCs are used in a variety of electrical systems to convert electrical analog signals 3 into electrical digital signals. One type of ADC that is often used in electrical systems is called a full flash ADC. Another type of ADC that is often used in electrical systems is called a two-step ADC. In a full flash ADC, many comparators arranged in parallel with one another simultaneously receive the input analog voltage signal and the same clock signal. All bit decisions are made simultaneously based on the outputs of the comparators. In order to obtain high bit resolution at high speed, however, the comparators must be extremely fast. The use of such a large number of comparators results in a large amount of area and a large amount of power being consumed by the flash ADC. In addition, paralleling the large number of comparators results in high input capacitance, which limits the overall conversion speed of the full flash ADC.

Two-step ADCs use fewer comparators than full flash ADCs. In order to reduce the amount of area consumed by the ADC, a logical configuration is used that performs a combination of parallel and series conversions. The first step of the conversion process is a coarse conversion process that decides the values of the more significant bits of the multi-bit number that will ultimately be used to digitally represent the analog input voltage signal. The second step of the conversion process is a fine conversion process that decides the values of the less significant bits of the multi-bit number that will ultimately be used to digitally represent the analog input voltage signal. During the fine conversion process, the bits decided by the coarse conversion process are used to perform sub-ranging operations on either the input signal or the reference input signal to the fine conversion process. The fine conversion process then decides the values of the bits of less significance using either the sub-ranged input signal or the sub-ranged reference signal, or both The more significant bits decided by the coarse conversion process and the less significant bits decided by the fine conversion process are then combined to produce the ADC multi-bit output signal.

The two-step conversion process performed by the two-step ADC requires more time than the full conversion process performed by the flash ADC due to the fact that not all bit decisions are made in parallel, i.e., simultaneously, in the two-step ADC. An advantage of two-step ADCs is that they employ fewer comparators than the number of comparators employed in full flash ADCs. Consequently, two-step ADCs typically consume less power and require less chip area than full flash ADCs. For this reason, two-step ADCs are often preferred over full-flash ADCs.

FIG. 1 illustrates a block diagram of a known two-step ADC 2. The ADC 2 comprises a sampler 3, a CADC circuit 4, and FADC circuit 5, a sub-range multiplexer (MUX) 6, and an encoder 7. The sampler 3 receives an analog input voltage signal, ADC_IN, and a clock signal, ADC_CLK. The sampler 3 includes sampling circuitry (e.g., an n-type MOS switch) that samples ADC_IN on the rising edge of ADC_CLK and produces a signal sample value on the falling edge of ADC_CLK. The sampling process performed by the sampler 3 is typically referred to as Track and Hold (T/H) sampling.

The signal sample value that is output from the sampler 3 is received by the CADC circuit 4 and by the FADC circuit 5. However, the CADC circuit 4 processes the signal sample value before the FADC circuit 5 processes the signal sample value. The CADC circuit 4 processes the signal sample value output from the sampler 3 and decides the values of the more significant bits of the multi-bit signal that will ultimately be used to represent ADC_IN in digital format. The bit decisions produced by the CADC circuit 4 are used by the sub-ranging MUX 6 to either sub-range the value of signals that are input to the comparators (not shown) of the FADC circuit 4 or to sub-range the value of the reference signal that is used by the comparators of the FADC circuit 4. The FADC circuit 4 decides the values of the less significant bits of the multi-bit signal that will ultimately be used to represent ADC_IN in digital format. The encoder 7 combines the bit decisions produced by the FADC circuit 5 with the bit decisions produced by the CADC circuit 4 to obtain the final multi-bit number that is output from the ADC 2, ADC_Out.

In general, the disadvantage of two-step ADCs compared to full flash ADCs is the need for a clocking scheme in two-step ADCs that assigns different clock signal phases for use in the T/H sampling, the T/H buffer settling, the CADC conversion, the sub-ranging MUX conversion, and the FADC conversion. For the traditional two-step sub-ranging ADC shown in FIG. 1, a simple open loop buffer arrangement is used for the sampling operations performed in the sampler 3. The use of the open loop buffer arrangement results in a total settling time window of only $\frac{1}{2}t_{CLK}$ being available for T/H buffer settling, CADC conversion, sub-ranging conversion, and FADC conversion, where $t_{CLK}$ is equal to one clock period of ADC_CLK. The use of a closed loop T/H amplifier instead of an open loop buffer in the sampler 3 would essentially double this settling time window by allowing the sampler 3 to obtain the next sample value without affecting the conversion process being performed in the FADC circuit 4. However, for similar bandwidth and driving capability, a two-step ADC that uses a closed loop T/H amplifier generally consumes significantly more power and chip area than that consumed by a two-step ADC that uses an open loop buffer.

FIG. 2 illustrates a block diagram of another typical two-step sub-ranging ADC 12. The ADC 12 shown in FIG. 2 is similar to the ADC 2 shown in FIG. 1 except that the ADC 12 uses two FADC circuits 15A and 15B and two sub-ranging MUXes 16A and 16B. The FADC circuits 15A and 15B are often referred to as being "interleaved". The use of the two FADC circuits 15A and 15B results in a settling time window, TW, of $\frac{1}{2}t_{CLK}$ for each of the CADC conversion process, the MUX sub-ranging conversion process, and the FADC conversion process, where $t_{CLK}$ is the length of time of one clock cycle of clock signal ADC_CLK. In other words, the use of the two interleaved FADC circuits 15A and 15B provides a total settling time window, $TW_{TOTAL}$, of $1.5t_{CLK}$ for all of the CDAC, MUX sub-ranging and FADC conversion processes to complete. Similarly, two CADC circuits, or two CADC circuits plus two FADC circuits (not shown), can also be interleaved to obtain a similar improvement in the total settling time window.

The tradeoffs of using two FADC circuits or two CADC circuits to increase the settling time window are that more chip area and power are consumed by the comparators (not shown) of the sampler 3 due to the increased load created by the additional FADC or CADC circuits. Another tradeoff is that when multiple CADC or FADC circuits are used, there is an increase in the number of sources of potential bit decision mismatches in the CADC circuits or the FADC circuits, respectively.

A need exists for a two-step ADC that is capable of achieving an increased settling time window without increasing the amount of chip area and power that are consumed by the ADC and without increasing the number of sources of potential bit decision mismatches.

SUMMARY OF THE INVENTION

The invention is directed to a two-step sub-ranging ADC and method that provide an increased overall timing margin window without increasing power consumption and without increasing the amount of die area required for implementation of the ADC. The ADC comprises a first sampler/buffer circuit, a second sampler/buffer circuit, a first MUX, a second MUX, a CADC circuit, an FADC circuit, a sub-ranging MUX, and an encoder. The first sampler/buffer circuit is configured to obtain odd samples of an analog input signal, ADC_IN, during odd phases of a first clock signal, ADC_CLK. The second sampler/buffer circuit is configured to obtain even samples of ADC_IN during even phases of ADC_CLK. The first MUX is configured to select an odd sample obtained by the first sampler/buffer circuit at a first instant in time and to select an even sample obtained by the second sampler/buffer circuit at a second instant in time. The second MUX is configured to select an even sample obtained by the second sampler/buffer circuit at the first instant in time and to select an odd sample obtained by the first sampler/buffer circuit at the second instant in time. The CADC circuit is configured to receive samples selected by the first MUX and to process the received samples to produce CADC decision values. The FADC circuit is configured to receive samples selected by the second MUX and to process the received samples to produce FADC decision values. The sub-ranging MUX is configured to sub-range the FADC circuit. The encoder is configured to process the CADC and FADC decision values to produce output ADC values.

The method comprises the following:

in a first sampler/buffer circuit, sampling an analog input signal, ADC_IN, during odd phases of a first clock signal, ADC_CLK, to obtain odd samples of ADC_IN, in a second sampler/buffer circuit, sampling ADC_IN during even phases of ADC_CLK to obtain even samples of ADC_IN, in a first MUX, selecting an odd sample obtained by the first sampler/buffer circuit at a first instant in time and selecting an even sample obtained by the second sampler/buffer circuit at a second instant in time, in a second MUX, selecting an even sample obtained by the second sampler/buffer circuit at the first instant in time and selecting an odd sample obtained by the first sampler/buffer circuit at the second instant in time, in a CADC circuit, receiving samples selected by the first MUX and processing the received samples to produce CADC decision values, in a FADC circuit, receiving samples selected by the second MUX and processing the received samples to produce FADC decision values, in a sub-ranging MUX, sub-ranging the FADC circuit, and in an encoder, processing the CADC and FADC decision values and producing output ADC values.

These and other features and advantages of the invention will become apparent from the following description, drawings and claims.

DETAILED DESCRIPTION OF AN ILLUSTRATIVE EMBODIMENT

In accordance with the invention, a two-step sub-ranging ADC is provided that achieves significant improvements in the settling time window available for the CADC, MUX sub-ranging and FADC conversion processes without increasing the amount of chip area or power that are consumed by the ADC. The ADC uses interleaved sampler/buffer circuits to sample the incoming analog signal on different phases of the clock signal. MUXes provide the samples obtained by the sampler/buffer circuits to the CADC and FADC circuits in ping pong fashion in such a way that the CADC and FADC circuits are converting during every clock period. In addition, these improvements are achieved without increasing the number of potential sources of bit decision mismatches in the two-step ADC.

The two-step sub-ranging ADC is typically integrated into an integrated circuit (IC). The IC that incorporates the ADC typically also contains other types of circuits for performing other types of functions. The invention is not limited with respect to the type of IC in which the ADC is incorporated or with respect to the overall purpose of the IC. The IC is typically part of a system. The invention also is not limited with respect to the type of system in which the IC that contains the ADC is incorporated or with respect to the overall purpose of the system.

Figure 1:
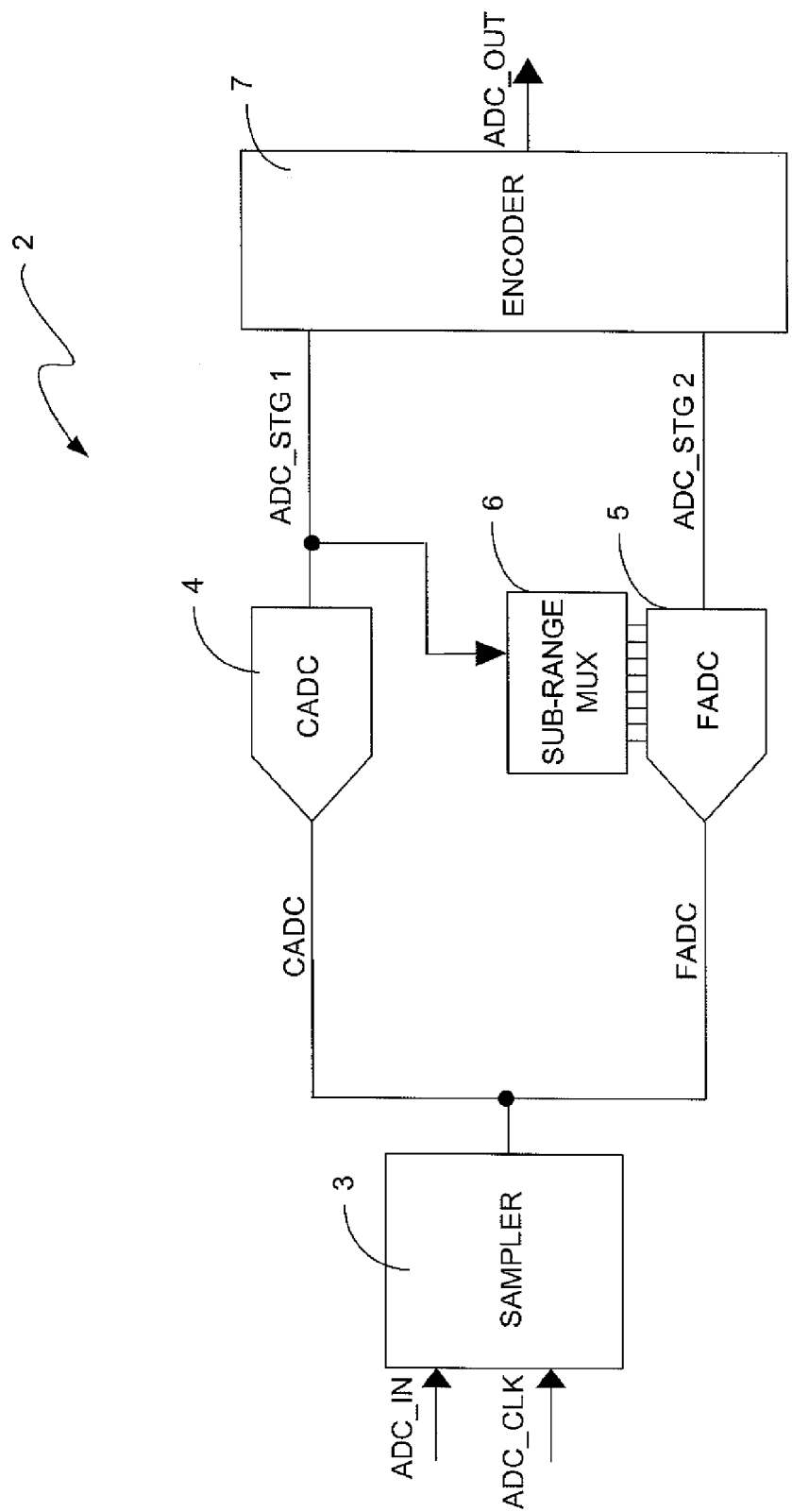
FIG. 1 illustrates a block diagram of a known two-step ADC.
Figure 2:
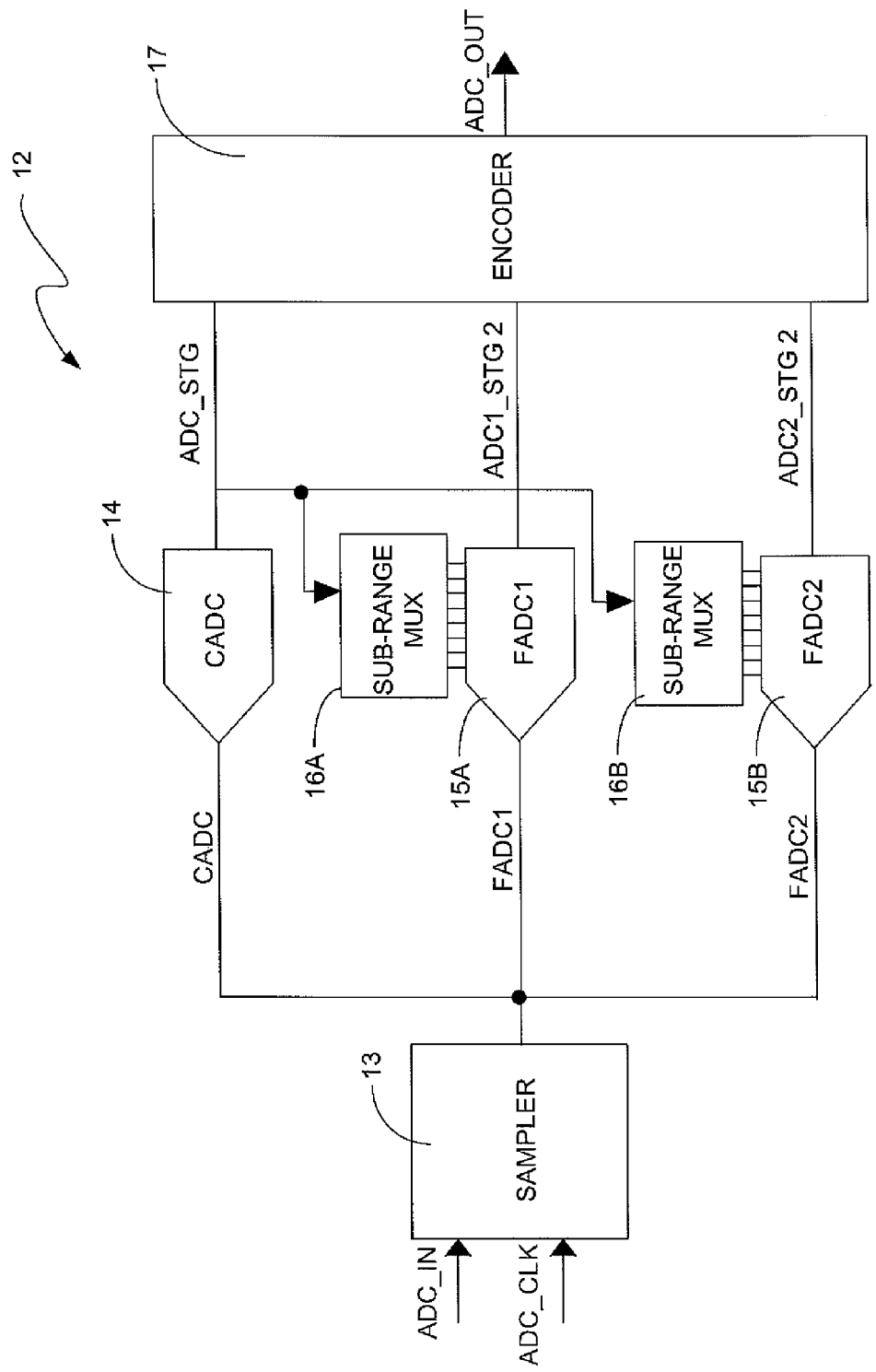
FIG. 2 illustrates a block diagram of another typical two-step sub-ranging ADC.
Figure 3:
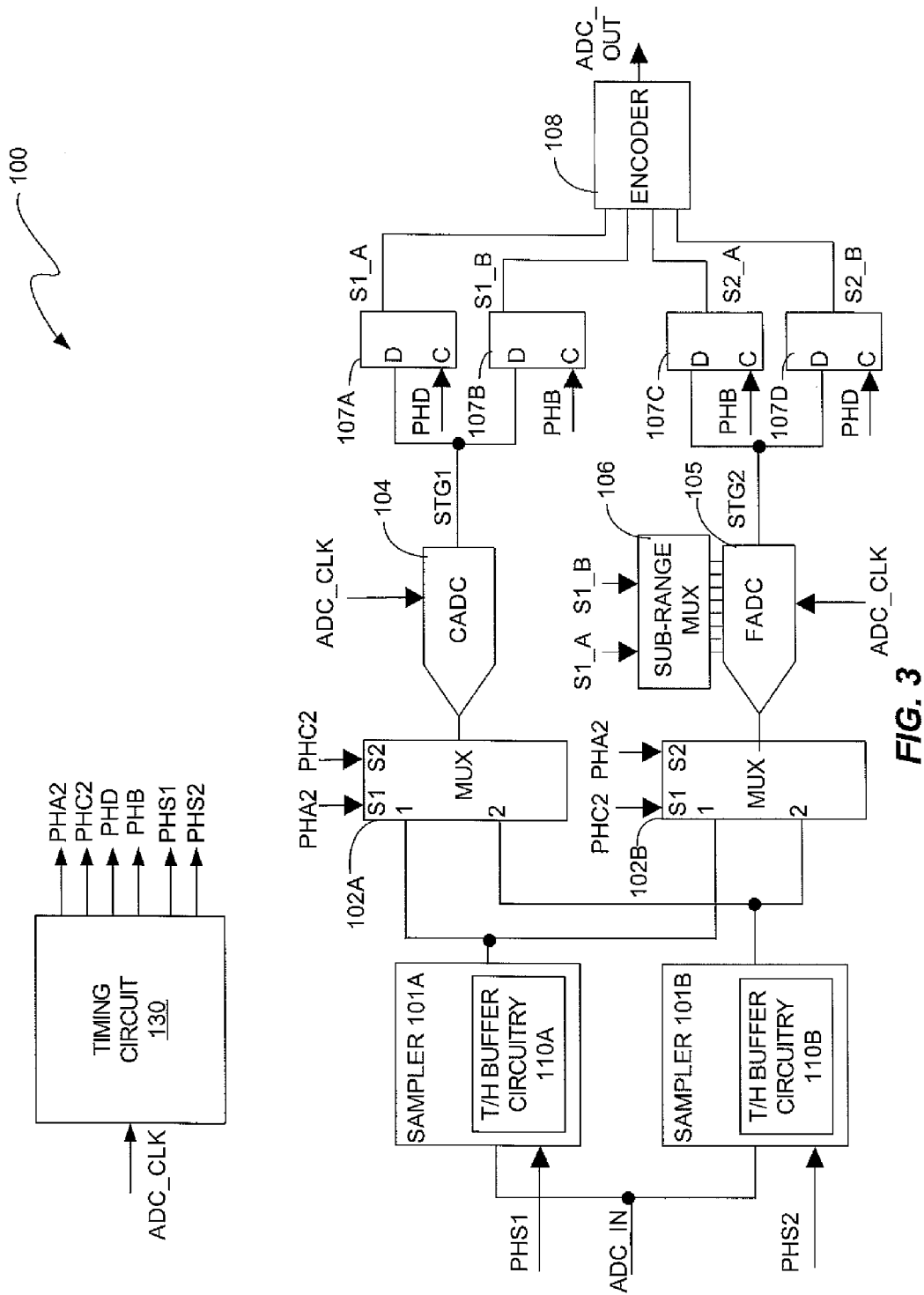
FIG. 3 illustrates a block diagram of the two-step sub-ranging ADC in accordance with an illustrative embodiment of the invention.

FIG. 3 illustrates a block diagram of the two-step ADC 100 in accordance with an illustrative embodiment of the invention. In accordance with this embodiment, instead of interleaving FADC circuits or CADC circuits in the manner described above with reference to FIG. 2, two samplers (SAMPLER 101A and SAMPLER 101B) are interleaved in ping-pong fashion to enable a larger settling time window to be achieved. SAMPLERS 101A and 101B employ open loop T/H BUFFER circuitry 110A and 110B, respectively, as opposed to the aforementioned closed loop T/H amplifier circuitry. While it is known to use multiple samplers in ADCs, it is not known to use two samplers in combination with unique clocking and MUXing schemes with both the CADC and FADC circuits shared for a two-step sub-ranging ADC. The new interleaved structure and clocking and MUXing schemes of the invention enable the total settling time window, $TW_{TOTAL}$, to be increased without increasing the amount of chip area and power consumed, and without sacrificing bit decision integrity and/or throughput. As will be described below in detail with reference to FIG. 4, the two-step ADC 100 provides a total timing window $TW_{TOTAL}$ that is equal to or greater than $2t_{CLK}$, where $t_{CLK}$ is one period of the ADC clock, ADC_CLK.

The SAMPLERS 101A and 101B sample ADC_IN on odd and even phases, PHS1 and PHS2, respectively, of the ADC_CLK. A timing circuit 130 comprises logic that receives ADC_CLK and modifies ADC_CLK by, for example, using one or more frequency dividers and/or one or more delay elements to divide and/or delay ADC_CLK to produce timing signals PHS1, PHS2, PHA2, PHC2, PHB, and PHD, which control the timing of the components of the ADC 100 shown in FIG. 3. These timing signals and their relationship to the ADC_CLK and to the components shown in FIG. 3 will be described below in detail with reference to FIGS. 4, 5 and 7.

The ADC 100 employs a single CADC circuit 104, a single FADC circuit 105, a single sub-ranging MUX 106, a pair of sample MUXes 102A and 102B, two pairs of D flip flops 107A, 107B, 107C, and 107D, and an encoder 108. In accordance with this embodiment of the invention, the inputs to both the CADC circuit 104 and FADC circuit 105 are the multiplexed outputs of a pair of sampler/buffers, namely, SAMPLER 101A/BUFFER 110A and SAMPLER 101B/BUFFER 110B. An embodiment of the sampler/buffer pairs is described below with reference to FIGS. 8A and 8B. For simplicity, it will be assumed that logic high assertion is used for the SAMPLER 101A and SAMPLER 101B and for the MUXes 102A and 102B. As will be understood by persons of ordinary skill in the art, logic low assertion could instead be used.

MUX 102A and MUX 102B, which are controlled by a pair of complementary signals, are arranged to cause the odd samples from SAMPLER 101A/BUFFER 110A and the even samples from SAMPLER 101B/BUFFER 110B to ping-pong between the CADC circuit 104 and the FADC circuit 105. In particular, the MUXes 102A and 102B multiplex the outputs of SAMPLER/BUFFER 101A/110A and SAMPLER/BUFFER 101B/110B such that the values of the odd samples from SAMPLER/BUFFER 101A/110A are sequentially provided to the CADC circuit 104 and the FADC circuit 105 every ADC_CLK clock period, while the values of the even samples from SAMPLER/BUFFER 101B/110B are sequentially provided to the CADC circuit 104 and the FADC circuit 105 every ADC_CLK clock period. For example, the MUXes 102A and 102B provide an odd sample value and an even sample value, respectively, to the CADC circuit 104 and the FADC circuit 105, respectively, during an ADC_CLK period. Then, during the next ADC_CLK period, the MUXes 102A and 102B provide an odd sample value and an even sample value, respectively, to the FADC circuit 105 and the CADC circuit 104, respectively. Since even samples are sampled one clock period later than the odd samples, the CADC and FADC circuits 104 and 105 are simultaneously converting adjacent samples separated in time by one ADC_CLK period within any conversion window. In this way, there is never an ADC_CLK clock period when the CADC and FADC circuits 104 and 105 are not performing their respective conversions, as will be described below in more detail with reference to FIG. 4.

When the CADC circuit 104 outputs the odd sample conversion result, S1_A, the sub-ranging MUX 106 performs sub-ranging multiplexing using that conversion result to sub-range either the inputs of the FADC circuit 105 or to sub-range the references of the FADC circuit 105. Likewise, when the CADC circuit 104 outputs the even sample conversion result, S1_B, the sub-ranging MUX 106 performs sub-ranging multiplexing using that conversion result. The CADC, FADC and sub-ranging MUX circuits 104, 105 and 106 may use configurations that are known in the art of two-step sub-ranging ADCs. Therefore, a detailed discussion of the configurations and operations performed by the CADC circuit 104, the FADC circuit 105 and the sub-ranging MUX 106 will not be provided herein.

Figure 4:
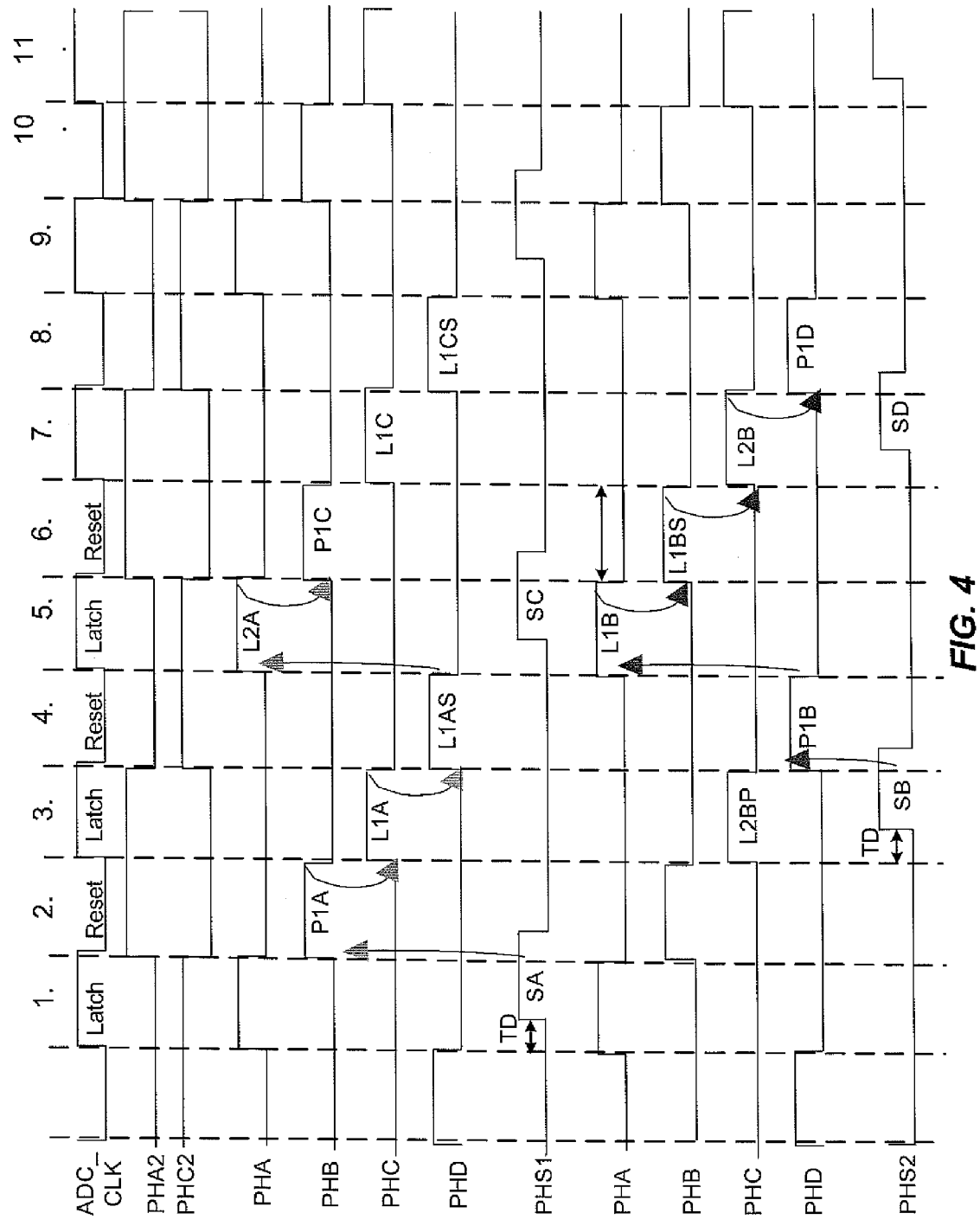
FIG. 4 illustrates a timing diagram that demonstrates the timing of events in the ADC shown in FIG. 3 in accordance with an embodiment.

A timing diagram that demonstrates the timing of the signals shown in FIG. 3 relative to one another is shown in FIG. 4. The manner in which the two-step ADC shown in FIG. 3 operates will now be described with reference to FIGS. 3 and 4. With the timing scheme represented by the timing diagram of FIG. 4, a settling time window TW of about $\frac{1}{2}t_{CLK}$ is achieved for each of T/H buffer settling, CADC conversion, sub-ranging MUX settling, and FADC conversion, without the need for expensive closed loop T/H amplifiers and distributed T/H comparators. A settling time window TW for each of these operations results in a total settling time window $TW_{TOTAL}$ of about at least $2t_{CLK}$ for all of these operations to be performed. The large settling time window TW for each operation enables comparators that are small in size to be used in the ADC 100, which reduces the amount of chip area and power that are consumed by the ADC 100. In addition, by enabling comparators that are small in size to be used in the CADC and FADC circuits 104 and 105, the loading on the SAMPLERS 101A and 101B can be reduced, which further reduces the amount of power that is consumed by the open loop T/H BUFFERS 110A and 110B of the SAMPLERS 101A and 101B, respectively.

With reference to FIG. 4, the timing signals PHA, PHB, PHC, and PHD are each half-rate signals (i.e., half the rate of ADC_CLK) having 25% duty cycles. The signals PHB and PHD are used as clock signals to control the flip flops 107A-107D. The timing signals PHA2 and PHC2 are half-rate clock signals relative to ADC_CLK having 50% duty cycles. The select inputs S1 and S2 for the MUX 102A are controlled by signals PHA2 and PHC2, respectively, while the select inputs S1 and S2 for the MUX 102B are controlled by signals PHC2 and PHA2, respectively. Because signals PHA2 and PHC2 are complementary signals, when the output of the SAMPLER 101A/BUFFER 110A is multiplexed to the CADC circuit 104 at any given instant in time, the output of the SAMPLER 101B/BUFFER 110B is multiplexed to the FADC circuit 105 at the same instant in time (i.e., simultaneously), and vice verse. Consequently, the values of odd samples output from SAMPLER 101A/BUFFER 110A are sequentially provided to the CADC circuit 104 and to the FADC circuit 105 every ADC_CLK clock period when PHA2 and PHC2 are asserted sequentially. Likewise, the values of the even samples output from the SAMPLER 101B/BUFFER 110B are sequentially provided to the CADC circuit 104 and to the FADC circuit 105 every ADC_CLK period when signals PHC2 and PHA2 are asserted sequentially. Since even samples are sampled one clock period later than odd samples, this means that during any conversion window, the CADC and FADC circuits 104 and 105 are simultaneously converting adjacent samples that are separated in time from each other by one ADC_CLK.

The MUXing operations performed by MUXes 102A and 102B are referred to herein as "next-phase" MUXing due to the fact the MUXing operations occur at instants in time that occur at the end of the previous sampling phase. The timing signal PHA and PHC shown in FIG. 4 are not directly used in the ADC 100 shown in FIG. 3, but are used in the timing circuit 130 to derive the clock signals PHS1 and PHS2, respectively. The timing signals PHA and PHC are half-rate signals having 25% duty cycles. On the falling edge of PHA, PHA2 goes high and PHC2 goes low. On the falling edge of PHC, PHC2 goes high and PHA2 goes low.

The clock signals PHS1 and PHS2 are the sampling clock signals for controlling the samplers 101A and 101B, respectively. The clock signals PHS1 and PHS2 are half-rate signals that are delayed versions of signals PHA and PHC, respectively. The signals PHS1 and PHS2 are delayed by a delay time, TD, relative to signals PHA and PHC, respectively, and have 25% duty cycles. The purpose of delaying the clock signals PHS1 and PHS2 by TD is to provide time to ensure that the CADC circuit 104 and the FADC circuit 105 perform their conversions on the sample previously latched into one of the SAMPLERS 101A or 101B instead of on the sample currently being latched into one of the SAMPLERS 101A and 101B. Due to the fact that open loop T/H BUFFERS 110A and 110B are used in the SAMPLERS 101A and 101B, it is important that the timing delay TD be longer than the hold time of the comparator array (not shown) of the CADC circuit 104 and of the FADC circuit 105 to ensure that the CADC and FADC circuits 104 and 105 make the correct bit decisions before receiving the next sample. Otherwise, the current sample would arrive at the CADC and FADC circuits 104 and 105 before bit decisions have been made on the previous sample, which could result in incorrect bit decisions.

The following is an example that demonstrates the manner in which an input sample, referred to herein as "SA", obtained by SAMPLER 101A of the ADC 100 shown in FIG. 3 is converted from an analog voltage value into a digital voltage value. The high state of PHS1 represents the sampling timing window for sampling ADC_IN with SAMPLER 101A. The sampling timing window for obtaining sample SA is equal to about $\frac{1}{2}t_{CLK}$. This sampling timing window is labeled SA in FIG. 4. As shown in FIG. 4, PHS1 is delayed from PHA by a small time delay of TD. The purpose for the small TD is to provide time for the CADC circuit 104 to finish processing the previous sample obtained by SAMPLER 101B before receiving the current sample from SAMPLER 101A. On the falling edge of PHS1, the T/H BUFFER 110A begins holding the value of the input value, which is SA.

After PHS1 goes low, a settling time period occurs during which the T/H BUFFER 110A of SAMPLER 101A is allowed to settle for about $\frac{1}{2}t_{CLK}$–TD. This settling time window is labeled as P1A in FIG. 4. At the same time that PHB goes high and PHA goes low, the control signal PHC2 goes low and the control signal PHA2 goes high, causing the MUX 102A to provide the odd sample SA to the CADC circuit 104 and causing the MUX 102B to provide the previous even sample prior to sample SB, which will be referred to hereinafter as "SBP", to the FADC circuit 105. At the end of the settling time period P1A, the CADC circuit 104 begins performing its conversion, i.e., making the bit decisions for odd sample SA while the FADC circuit 105 begins performing its conversion, i.e., making the bit decision for even sample SBP. The timing margin period for the CADC circuit 104 to perform its conversion is labeled L1A in FIG. 4 and is equal to about $\frac{1}{2}t_{CLK}$, while the timing margin period for the FADC circuit 105 to perform its conversion is labeled L2BP in FIG. 4 and is also equal to about $\frac{1}{2}t_{CLK}$.

At the end of timing margin period L1A, the bit decision value STG1 produced by the CADC circuit 104 is available at the input of D flip flops 107A and 107B. The rising edge of PHD occurs at this instant in time, causing the coarse bit decision value STG1 at the input of D flip flop 107A to be propagated to the output of the D flip flop 107A. The coarse bit decision value at the output of D flip flop 107A is labeled S1_A in FIG. 3. Likewise, at the end of timing margin period L2BP, which coincides with the end of timing margin period L1A, the fine bit decision value STG2 produced by the FADC circuit 105 is available at the input of D flip flops 107C and 107D. Consequently, when the rising edge of PHD occurs at this instant in time, the fine bit decision value STG2 at the input of D flip flop 107D is propagated to the output of the D flip flop 107D.

At the same time that the rising edge of PHD occurs causing the bit decision values STG1 and STG2 to be propagated to the outputs of D flip flops 107A and 107D, PHC goes low, which causes the MUX control signals PHA2 and PHC2 to go low and high, respectively. This causes the MUX 102A to provide sample SB obtained by SAMPLER 101B to the CADC 104 and causes MUX 102B to provide sample SA obtained by SAMPLER 101A to the FADC circuit 105. Thus, as soon as the CADC circuit 104 has completed processing sample SA (i.e., at the end of the timing margin period L1A), the CADC circuit 104 begins processing sample SB. The CADC circuit 104 begins the processing of sample SB after a settling time of $\frac{1}{2}t_{CLK}$ reserved for T/H BUFFER 110B to settle after the switching of MUX 102A, which corresponds to the timing margin window labeled P1B in FIG. 4. The CADC circuit 104 completes the processing of sample SB after a settling time of $\frac{1}{2}t_{CLK}$, which corresponds to the timing margin window labeled L1B in FIG. 4. Similarly, as soon as the FADC circuit 105 has completed processing sample SBP (i.e., at the end of timing margin period L2BP), the FADC circuit 105 begins processing sample SA.

On the rising edge of PHD, the output S1_A of flip flop 107A is passed to the sub-ranging MUX 106, which uses it to sub-range either the inputs or the references of the FADC circuit 105 for reference switching and/or input sub-ranging. A settling time period of about $\frac{1}{2}t_{CLK}$, which is labeled L1AS in FIG. 4, is provided for the latching setup and delay of the D flip flop 107A and for the MUX 106 to sub-range the inputs and/or references of the FADC circuit 105. On the next falling edge of PHD, which coincides with the rising edge of PHA, the FADC circuit 105 begins its conversion process. The timing margin that is provided for the FADC circuit 105 to perform its conversion, which is labeled L2A in FIG. 4, is also about $\frac{1}{2}t_{CLK}$. At the end of the timing margin period L2A, the fine bit decision value, STG2, for sample SA is available at the inputs to D flip flops 107C and 107D. At this instant in time, PHB goes high causing the fine bit decision value STG2 for SA to be propagated to the output of D flip flop 107C. Thus, at the end of timing margin period L2A, the coarse and fine bit decision values output from flip flops 107A and 107C are ready for processing by the encoder 108.

At the same instant in time that PHB goes high at the end of timing margin period L2A, PHA goes low, causing the MUX control signals PHA2 and PHC2 to go high and low, respectively. This causes the next odd sample, referred to herein as "SC", to be MUXed to the CADC circuit 104 and the next even sample SB to be MUXED to the FADC circuit 105. Also at this same instant in time, the bit decisions value STG2 for sample SA output from the FADC circuit 105 propagates through D flip flop 107C such that it becomes available at the output of flip flop 107C. The value at the output of flip flop 107C is labeled S2_A in FIG. 3.

The conversion of input sample SB is exactly the same as that described above for sample SA, except that with sample SB there is an additional one ADC_CLK time period of latency, as will now be described. When PHS2 is high, this represents the sampling timing window for obtaining the SB sample with SAMPLER 101B. This sampling timing window, which is labeled SB in FIG. 4, is equal to about $½t_{CLK}$. Then, on the next falling edge of PHS2, sample SB is held by the T/H BUFFER 110B. Then, a settling time period equal to about $½t_{CLK}$–TD, which is labeled P1B in FIG. 4, passes during which the T/H BUFFER 110B settles. At the end of the sampling time period SB, the control signal PHC2 goes high and the control signal PHA2 goes low, causing the MUX 102A to provide sample SA stored in T/H BUFFER 110A to the FADC circuit 105 and causing the MUX 102B to provide sample SB stored in T/H BUFFER 110B to the CADC circuit 104. At the end of the settling time period P1B, the CADC circuit 104 begins performing its conversion, i.e., making the coarse bit decisions for sample SB, while the FADC circuit 105 begins performing its conversion, i.e., making the fine bit decisions for sample SA. The timing margin for the CADC circuit 104 to perform its conversion is labeled L1B in FIG. 4 and is equal to about $½t_{CLK}$. At the end of timing margin L1B, the coarse bit decision value STG1 produced by the CADC circuit 104 for sample SB is available at the input of D flip flops 107A and 107B. The rising edge of PHB occurs at the end of the timing margin L1B, causing the STG1 for sample SB to be propagated to the output of the D flip flop 107B. The bit decision value at the output of D flip flop 107B is labeled S1_B in FIG. 3. At the same instant time that the rising edge of PHB occurs, the MUX control signals PHA2 and PHC2 go high and low, respectively, causing the MUX 102A to provide the odd sample SC to the CADC 104 and causing the MUX 102B to provide the even sample SB to the FADC 105.

Also occurring on the rising edge of PHB, the output S1_B of flip flop 107B is passed to the sub-ranging MUX 106, which uses it to sub-range either the inputs or the references of the FADC circuit 105 for reference switching and/or input sub-ranging of the comparators. A settling time period of about $½t_{CLK}$ is provided for the latching setup and delay of the D flip flop 107B and for the MUX 106 to sub-range the inputs and/or references of the FADC circuit 105. This settling time period is referred to as L1BS in FIG. 4. At this instant in time, the control signals PHA2 and PHC2 go high and low, respectively, thereby causing the MUX 102B to provide the even sample SB to the FADC circuit 105, and causing the MUX 102A to provide the odd sample SC to the CADC 104. On the next falling edge of PHB, which coincides with the rising edge of ADC_CLK, the FADC circuit 105 begins its conversion process on sample SB. As indicated above, the timing margin that is provided for the FADC circuit 105 to perform its conversion is also about $½t_{CLK}$. At the end of this timing margin, the bit decision value STG2 for sample SB is available at the inputs of D flip flops 107C and 107D. At this same instant in time, PHD goes high causing the bit decision value STG2 to be propagated to the output of flip flop 107D as output S2_B, as indicated above.

When the bit decision values S1_A, S1_B, S2_A and S2_B are available at the outputs of the D flip flops 107A, 107B, 107C, and 107D, respectively, the encoder 108 processes these bit decision values in a known manner to produce the multi-bit digital output signal of the ADC 100, which is labeled ADC_OUT in FIG. 4. It should be noted that S1_A and S2_A, which are latched on the rising edges of PHD and PHB, respectively, are not available at the same instant in time at the outputs of their respective flip flips 107A and 107B, but are available at instants in time that are separated by one ADC_CLK period. Because PHB and PHD are half-rate clock signals, S1_A will still be valid when S2_A becomes available on the rising edge of PHB. Consequently, S1_A and S2_A will be both available and will be combined together in the encoder 108 on the rising edge of PHB. Similarly, S1_B and S2_B will both be available and will be combined together in the encoder 108 on the rising edge of PHD.

The manner in which encoders process the CADC and FADC bit decision values in two-step sub-ranging ADCs is well known in the art. Therefore, a description of the operations and configuration of the encoder 108 will not be provided herein. The encoder 108 may be configured to perform the same encoding scheme that has traditionally been used in known two-step sub-ranging ADCs. For example, assuming the CADC circuit 104 and the FADC circuit 105 are 1.0-bit and 5-bit circuits, respectively, the final ADC output value, ADC_OUT, for sample SA would be simply $((2^5 \times S1\_A)+S2\_A)$. Likewise, ADC_OUT for sample SB would be simply $((2^5 \times S1\_B)+S2\_B)$. It should be noted that although only four D flip flops are shown in FIG. 3, the number of flip flops that are used for this purpose will depend on the number of bits that are in the bit decision values. For example, assuming STG1 is a 3-bit value, the flip flops 107A and 107B would each comprise three flip flops, i.e., one flip flop for each of the bits. For ease of illustration, only four D flip flops are shown in FIG. 3. Also, it is not necessary that D flip flops be used for this purpose. Any type of memory element, such as a latch, for example, may be used for this purpose.

Thus, it can be seen from the description of FIGS. 3 and 4 above that a settling time window TW, also referred to interchangeably herein as a timing margin window, of about $½t_{CLK}$ is provided for each of CADC conversion, sub-ranging MUX settling and D flip flop delay, and FADC conversion. The settling time for each of the T/H BUFFERS 110A and 110B is only slightly less than $½t_{CLK}$ (i.e., $½t_{CLK}$–TD). Consequently, a total settling time window $TW_{TOTAL}$ of about at least $2t_{CLK}$ is provided for all of these operations to be performed. As indicated above, providing such a large settling time window enables comparators that are small in size to be used in the ADC 100, which reduces the amount of chip area and power that are consumed by the ADC 100. In addition, by enabling comparators that are small in size to be used in the CADC and FADC circuits 104 and 105, the loading on the T/H BUFFERS 110A and 110B is reduced, which further reduces the amount of power that is consumed by the T/H BUFFERS 110A and 110B of the SAMPLERS 101A and 101B, respectively.

Figure 5:
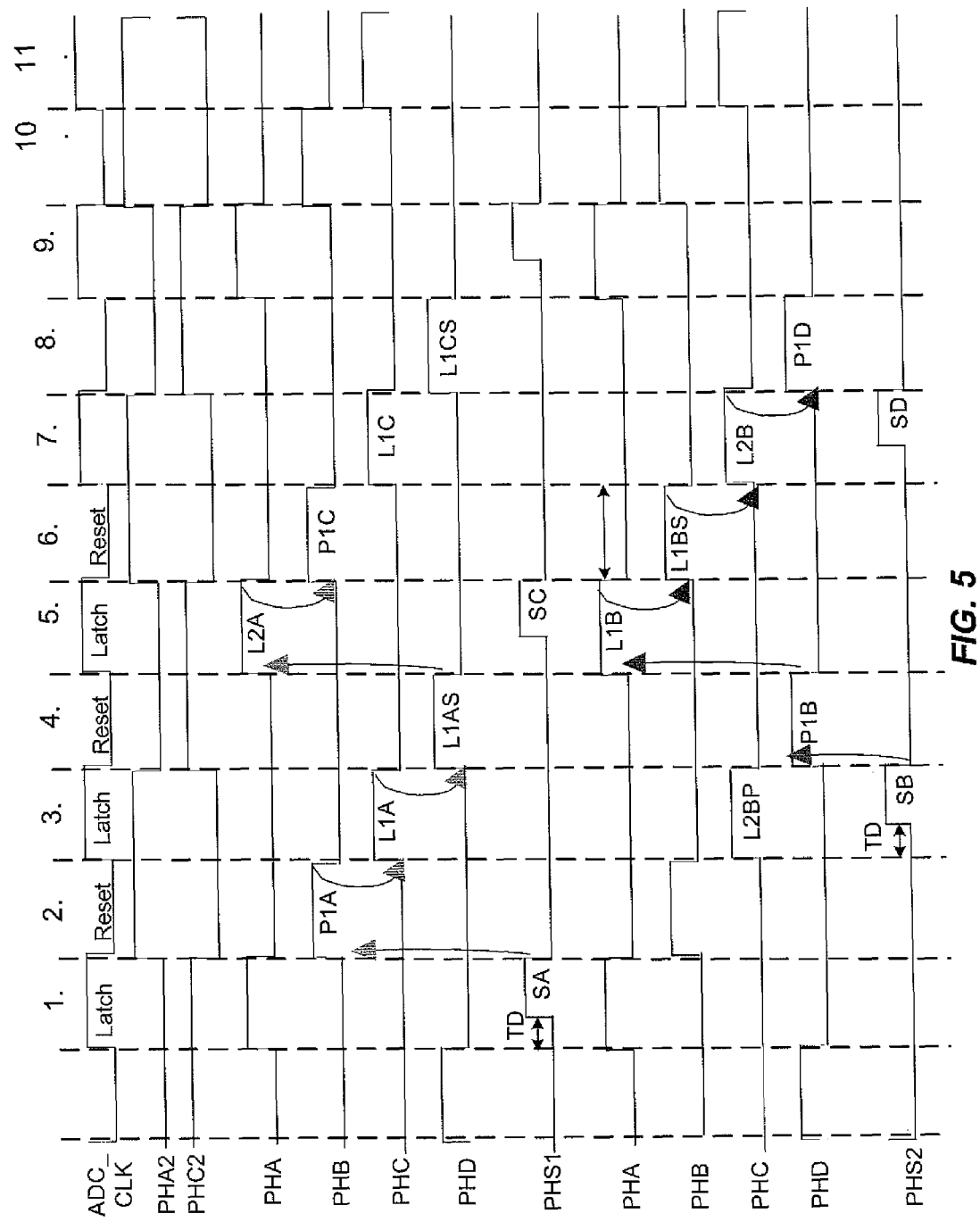
FIG. 5 illustrates a timing diagram that demonstrates the timing of events in the ADC shown in FIG. 3 in accordance with another embodiment, wherein a sampling phase narrowing technique is used.

A sampling phase narrowing technique may be used to narrow the sampling window such that a settling time is provided for the T/H BUFFERS 110A and 110B that is about $½t_{CLK}$. FIG. 5 illustrates a timing diagram that demonstrates the timing of events in the ADC 100 shown in FIG. 3 in the case where such a sampling phase narrowing technique is used. In this case, the clock signals PHS1 and PHS2 are still delayed by TD, but the signals PHS1 and PHS2 transition from the high state to the low state at the same instants in time that the signals PHA and PHC, respectively, transition from the high state to the low state. With the sampling phase narrowing technique, the sizes and the power consumption of the T/H BUFFERS 110A/110B can be reduced with a slight increase on the SAMPLER 101A/101B switch size, thus providing an overall savings in terms of both chip power and chip area consumption.

Figure 6:
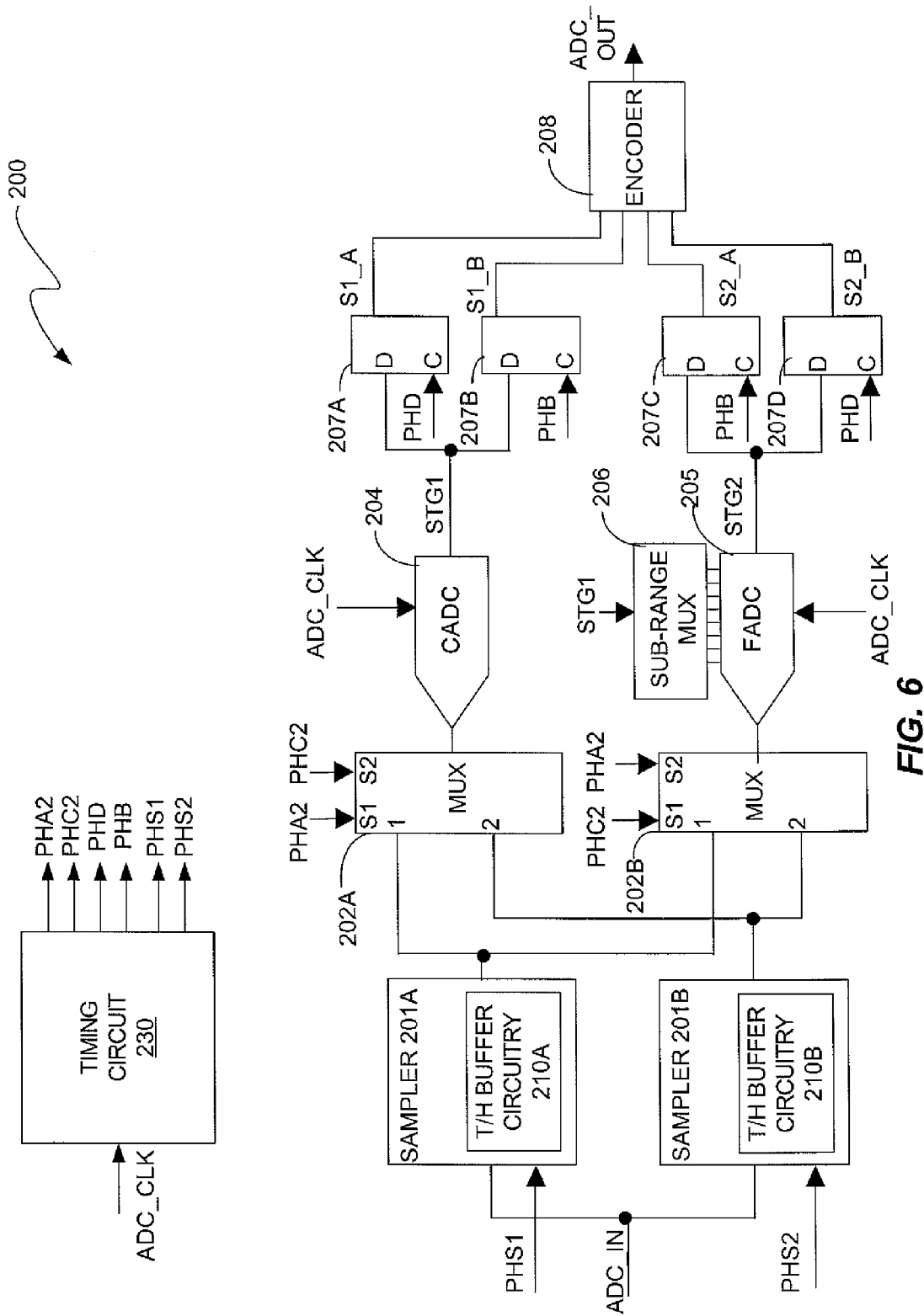
FIG. 6 illustrates a block diagram of the two-step sub-ranging ADC in accordance with another illustrative embodiment of the invention.

The ADC 100 shown in FIG. 3 may be modified in a number of ways while still achieving the goals of the invention. For example, the ADC 100 may be modified to perform a CADC direct feed-forward technique that provides additional settling time for sub-ranging of the inputs and/or references of the FADC circuit, as will now be described with reference to FIG. 6. FIG. 6 illustrates a block diagram of the two-step ADC 200 in accordance with another illustrative embodiment of the invention. The components 201A/210A, 201B/210B, 202A, 202B, 204, 205, 207A-207D, 208, and 230 shown in FIG. 6 are identical to the components 101A/110A, 101B/110B, 102A, 102B, 104, 105, 107A-107D, 108, and 130, respectively, shown in FIG. 3. However, in FIG. 6, rather than the FADC circuit 205 using the signals S1_A and S1_B output from the two D flip flops 207A and 207D to control the sub-ranging of the FADC circuit 205, the STG1 value output from the CADC circuit 204 is directly used to perform sub-ranging.

In accordance with the embodiment shown in FIG. 6, the comparators (not shown) of both the CADC and FADC circuits 204 and 205 are configured to have a latch phase and a reset phase, which enable the comparators to hold their previous values while they are being reset. To accomplish this, the comparators preferably have either RS-latch or D-latch configurations, which enable the comparators to hold their previous values while they are in reset mode. The manner in which comparators can be configured to have such latch configurations is well known in the art. This allows the sub-ranging of the references and/or of the inputs to the FADC circuit 205 to be performed using the STG1 value output directly from the CADC circuit 204. Consequently, the portions of the timing margin windows L1AS and L1BS that would otherwise be used for the setup and hold times of the D flip flops 207A and 207B are available for sub-ranging the references and/or inputs of the FADC circuit 205. Thus, the timing margin window that is available for sub-ranging is expanded.

Figure 7:
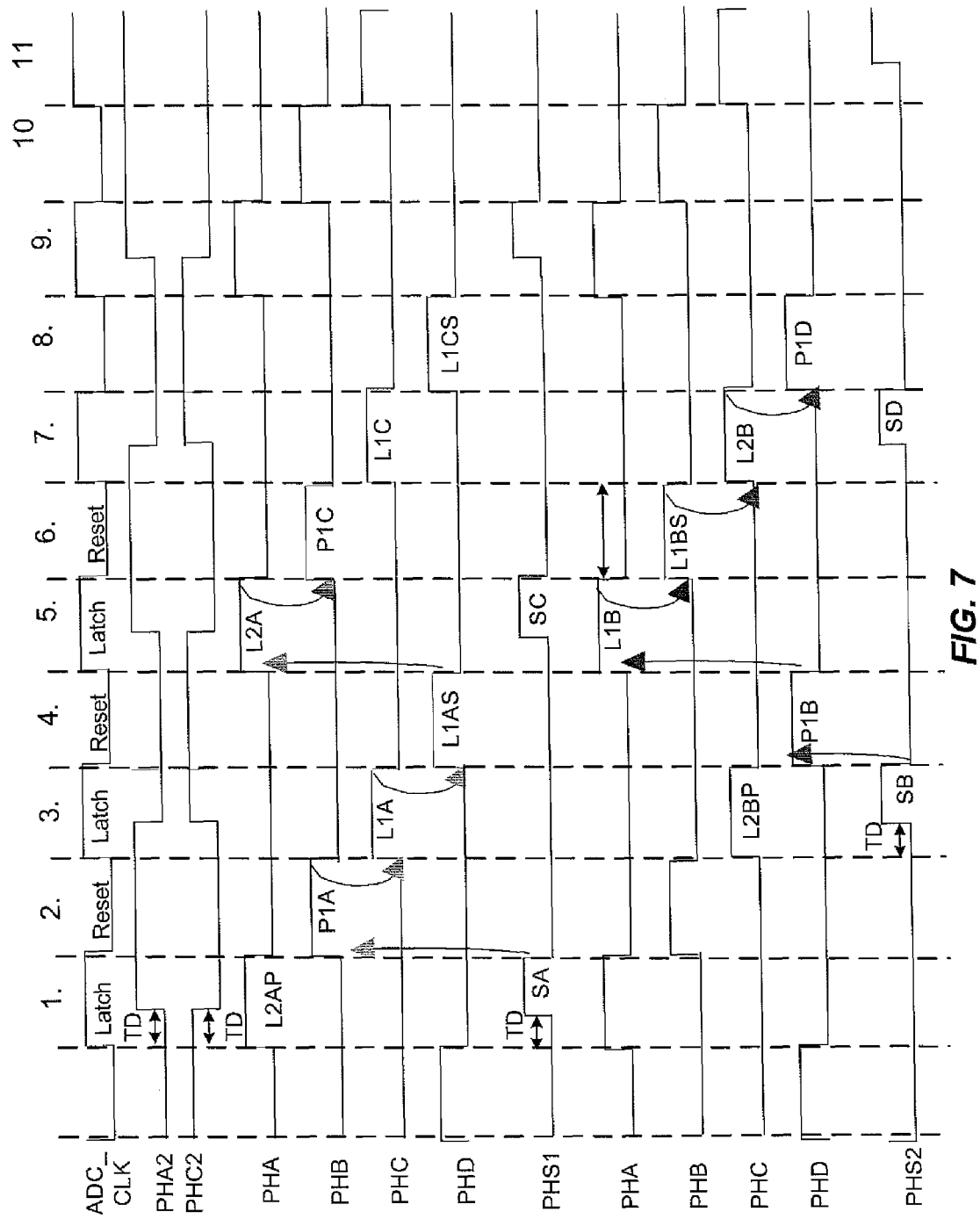
FIG. 7 illustrates a timing diagram that demonstrates the timing of events in the two-step ADC shown in FIG. 3 in accordance with yet another illustrative embodiment.

FIG. 7 illustrates a timing diagram that demonstrates the timing of events in the two-step ADC 100 shown in FIG. 3 in accordance with another illustrative embodiment. In accordance with this embodiment, the double sampling clocking scheme represented by the timing diagram shown in FIG. 5 has been modified to include a delayed current phase MUXing scheme. As with the timing diagram shown in FIG. 5, in accordance with this embodiment, a sampling phase narrowing technique is used. As with the timing diagrams shown in FIGS. 4 and 5, the clock signals PHS1 and PHS2 are still delayed by TD. As with the timing diagram shown in FIG. 5, the signals PHS1 and PHS2 transition from the high state to the low state at the same instants in time that the signals PHA and PHC, respectively, transition from the high state to the low state. Narrowing the sampling phase timing margin window in this manner allows the timing margin window that is available for multiplex switching of the input to the FADC circuit 105 to be expanded. The MUX control signals PHA2 and PHC2 are delayed in time by an amount, TD, which is matched with a time delay TD of the sampling phase timing signals PHS1 and PHS2. Matching these delays allows the sampling phase and buffer settling phase to occur before PHA2 and PHC2 switch their polarity, which, in turn, allows the input to the CDAC and FADC circuits 104 and 105 to be switched immediately. The conversions being performed by the CDAC and FADC circuits 104 and 105 will not be affected by the next samples held in the T/H BUFFERS 110A and 110B as long as TD is longer than the hold time of the comparators (not shown) of the CADC and FADC circuits 104 and 105, which is very easy to meet.

Figure 8A:
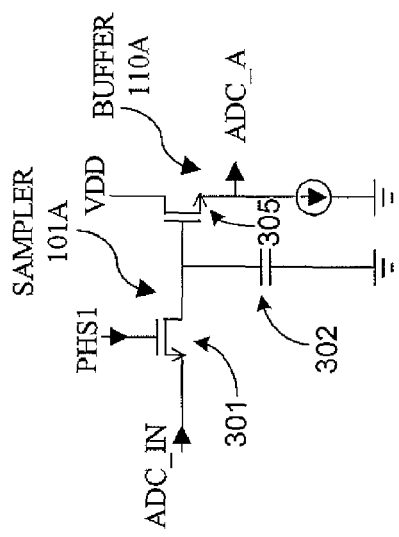
FIGS. 8A and 8B illustrate block diagrams of the SAMPLERS/BUFFERS of the ADCs shown in FIGS. 3 and 6.
Figure 8B:
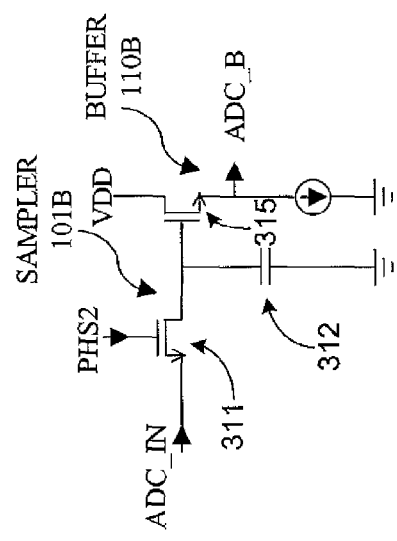

FIGS. 8A and 8B illustrate block diagrams demonstrating examples of the circuitry of the SAMPLER 101A/BUFFER 110A and SAMPLER 101B/BUFFER 110B, respectively, shown in FIGS. 3 and 6. The BUFFERS 110A and 110B are known circuits commonly referred to as source followers. Source followers are commonly used as open loop T/H buffers to avoid charge sharing and to drive either CADC or FADC circuits. Using simple buffers such as source followers as the open loop T/H buffer circuits instead of closed loop T/H amplifiers allows a reduction in die area and power consumption to be realized. With reference to FIG. 8A, the SAMPLER 101A/BUFFER 110A operates as follows. When PHS1 is in the low state, the transistor 301, which is n-type complementary metal oxide semiconductor field effect transistor (nFET) 301 is in the OFF state. In this state, the sampling capacitor 302 is holding the previous odd sample from ADC_IN, while the output of the BUFFER 110A is tracking the value from the sampling capacitor 302. When PHS1 is in the high state, nFET 301 switches to the ON state, which causes the capacitor 302 to track the input value ADC_IN, while the output of the BUFFER 110A keeps tracking the value from the capacitor 302. At the falling edge of PHS1, the capacitor 302 begins to hold the current odd sample of the ADC_IN input value at that instant in time, while the output of the BUFFER 110A keeps tracking the value from the capacitor 302. The SAMPLER 101B/BUFFER 110B shown in FIG. 8B operates in an identical manner, except that nFET 311 is controlled by timing signal PHS2 and the SAMPLER 101B/BUFFER 110B are working on the even sample. Of course, other circuit configurations may be used for this purpose, as well as other types of transistor technologies. For example, closed loop T/H buffers or amplifiers could be used instead of the open loop T/H buffers.

It should be noted that the invention has been described with reference to a few illustrative, or exemplary, embodiments. The invention is not limited to these embodiments. Persons of ordinary skill in the art will understand, in view of the description provided herein, that many modifications can be made to these embodiments without deviating from the scope of the invention. For example, the configurations and elements of the ADCs 100 and 200 can be modified in a variety of ways while still achieving the goals of the invention. In addition, while FIGS. 3 and 6 show single instances of the ADCs 100 and 200, respectively, multiple instances of these ADCs can be interleaved to provide additional advantages. For example, two instances of ADC 100 can be interleaved to double the timing margin window that is available for each operation while using a similar clocking scheme to one of the clocking schemes described above, except that ADC_CLK is replaced with a divide-by-2 full-rate ADC clock. These and other modifications are within the scope of the invention, as will be understood by persons of ordinary skill in the art in view of the description provided herein.

What is claimed is:

1. A two-step sub-ranging analog-to-digital converter (ADC) comprising:

a first sampler/buffer circuit configured obtain odd samples of an analog input signal, ADC_IN, during odd phases of a first clock signal, ADC_CLK;

a second sampler/buffer circuit configured to obtain even samples of the analog input signal ADC_IN during even phases of the first clock signal ADC_CLK;

a first multiplexer (MUX) configured to select an odd sample obtained by the first sampler/buffer circuit at a first instant in time and to select an even sample obtained by the second sampler/buffer circuit at a second instant in time;

a second MUX configured to select an even sample obtained by the second sampler/buffer circuit at the first instant in time and to select an odd sample obtained by the first sampler/buffer circuit at the second instant in time;

a coarse ADC (CADC) circuit, the CADC circuit being configured to receive samples selected by the first MUX and to process the received samples to produce CADC decision values;

a fine ADC (FADC) circuit, the FADC circuit being configured to receive samples selected by the second MUX and to process the received samples to produce FADC decision values;

a sub-ranging MUX circuit coupled to an input of the FADC circuit, the sub-ranging MUX circuit being configured to sub-range the FADC circuit; and an encoder configured to process the CADC and FADC decision values to produce output ADC values.

2. The two-step sub-ranging ADC of claim 1, wherein the CADC circuit receives the odd sample selected by the first MUX during a first clock period of ADC_CLK and receives the even sample selected by the first MUX during a second clock period of ADC_CLK, the first clock period occurring before the second clock period occurs, and wherein the CADC circuit processes the odd sample received in the CADC circuit to produce a first CADC decision value during the first clock period of ADC_CLK and processes the even sample received in the CADC circuit to produce a second CADC decision value during the second clock period of ADC_CLK.

3. The two-step sub-ranging ADC of claim 2, wherein the FADC circuit receives the even sample selected by the second MUX during the first clock period of ADC_CLK and receives the odd sample selected by the second MUX during the second clock period of ADC_CLK, and wherein the FADC circuit processes the even sample received in the FADC circuit to produce a first FADC decision value during the first clock period of ADC_CLK and processes the odd sample received in the FADC circuit to produce a second FADC decision value during the second clock period of ADC_CLK.

4. The two-step sub-ranging ADC of claim 1, wherein the CADC circuit receives the even sample selected by the first MUX during a first clock period of ADC_CLK and receives the odd sample selected by the first MUX during a second clock period of ADC_CLK, the first clock period occurring before the occurrence of the second clock period, and wherein the CADC circuit processes the even sample received in the CADC circuit to produce a first CADC decision value during the first clock period of ADC_CLK and processes the odd sample received in the CADC circuit to produce a second CADC decision value during the second clock period of ADC_CLK.

5. The two-step sub-ranging ADC of claim 3, wherein the FADC circuit receives the odd sample selected by the second MUX during the first clock period of ADC_CLK and receives the even sample selected by the second MUX during the second clock period of ADC_CLK, and wherein the FADC circuit processes the odd sample received in the FADC circuit to produce a first FADC decision value during the first clock period of ADC_CLK and processes the even sample received in the FADC circuit to produce a second FADC decision value during the second clock period of ADC_CLK.

6. The two-step sub-ranging ADC of claim 1, wherein the first instant in time occurs before the second instant in time occurs.

7. The two-step sub-ranging ADC of claim 1, wherein the second instant in time occurs before the first instant in time occurs.

8. The two-step sub-ranging ADC of claim 1, wherein the first sampler/buffer circuit comprises open loop circuitry.

9. The two-step sub-ranging ADC of claim 1, wherein the second sampler/buffer circuit comprises open loop circuitry.

10. The two-step sub-ranging ADC of claim 1, further comprising:

first flip flop circuitry configured to receive the CADC decision values produced by the CADC circuit and to temporarily store the CADC decision values before making the CADC decision values available to the encoder; and second flip flop circuitry configured to receive the FADC decision values produced by the FADC circuit and to temporarily store the FADC decision values before making the FADC decision values available to the encoder.

11. The two-step sub-ranging ADC of claim 1, wherein the ADC is part of an integrated circuit (IC) package.

12. An integrated circuit (IC) package comprising:

a two-step sub-ranging analog-to-digital converter (ADC) comprising:

a first sampler/buffer circuit configured obtain odd samples of an analog input signal, ADC_IN, during odd phases of a first clock signal, ADC_CLK;

a second sampler/buffer circuit configured to obtain even samples of the analog input signal ADC_IN during even phases of the first clock signal ADC_CLK;

a first multiplexer (MUX) configured to select an odd sample obtained by the first sampler/buffer circuit at a first instant in time and to select an even sample obtained by the second sampler/buffer circuit at a second instant in time;

a second MUX configured to select an even sample obtained by the second sampler/buffer circuit at the first instant in time and to select an odd sample obtained by the first sampler/buffer circuit at the second instant in time;

a coarse ADC (CADC) circuit, the CADC circuit being configured to receive samples selected by the first MUX and to process the received samples to produce CADC decision values;

a fine ADC (FADC) circuit, the FADC circuit being configured to receive samples selected by the second MUX and to process the received samples to produce FADC decision values;

a sub-ranging MUX circuit coupled to an input of the FADC circuit, the sub-ranging MUX circuit being configured to sub-range the FADC circuit; and an encoder configured to process the CADC and FADC decision values to produce output ADC values.

13. A method for performing two-step sub-ranging in an analog-to-digital converter (ADC), the method comprising:

in a first sampler/buffer circuit, sampling an analog input signal, ADC_IN, during odd phases of a first clock signal, ADC_CLK, to obtain odd samples of ADC_IN;

in a second sampler/buffer circuit, sampling ADC_IN during even phases of ADC_CLK to obtain even samples of ADC_IN;

in a first multiplexer (MUX), selecting an odd sample obtained by the first sampler/buffer circuit at a first instant in time and selecting an even sample obtained by the second sampler/buffer circuit at a second instant in time;

in a second MUX, selecting an even sample obtained by the second sampler/buffer circuit at the first instant in time and selecting an odd sample obtained by the first sampler/buffer circuit at the second instant in time;

in a coarse ADC (CADC) circuit, receiving samples selected by the first MUX and processing the received samples to produce CADC decision values;

in a fine ADC (FADC) circuit, receiving samples selected by the second MUX and processing the received samples to produce FADC decision values;

in a sub-ranging MUX coupled to an input of the FADC circuit, sub-ranging the FADC circuit; and in an encoder, processing the CADC and FADC decision values and producing output ADC values.

14. The method of claim 13, wherein the CADC circuit receives the odd sample selected by the first MUX during a first clock period of ADC_CLK and receives the even sample selected by the first MUX during a second clock period of ADC_CLK, the first clock period occurring before the second clock period occurs, and wherein the CADC circuit processes the odd sample received in the CADC circuit to produce a first CADC decision value during the first clock period of ADC_CLK and processes the even sample received in the CADC circuit to produce a second CADC decision value during the second clock period of ADC_CLK.

15. The method of claim 14, wherein the FADC circuit receives the even sample selected by the second MUX during the first clock period of ADC_CLK and receives the odd sample selected by the second MUX during the second clock period of ADC_CLK, and wherein the FADC circuit processes the even sample received in the FADC circuit to produce a first FADC decision value during the first clock period of ADC_CLK and processes the odd sample received in the FADC circuit to produce a second FADC decision value during the second clock period of ADC_CLK.

16. The method of claim 13, wherein the CADC circuit receives the even sample selected by the first MUX during a first clock period of ADC_CLK and receives the odd sample selected by the first MUX during a second clock period of ADC_CLK, the first clock period occurring before the occurrence of the second clock period, and wherein the CADC circuit processes the even sample received in the CADC circuit to produce a first CADC decision value during the first clock period of ADC_CLK and processes the odd sample received in the CADC circuit to produce a second CADC decision value during the second clock period of ADC_CLK.

17. The method of claim 16, wherein the FADC circuit receives the odd sample selected by the second MUX during the first clock period of ADC_CLK and receives the even sample selected by the second MUX during the second clock period of ADC_CLK, and wherein the FADC circuit processes the odd sample received in the FADC circuit to produce a first FADC decision value during the first clock period of ADC_CLK and processes the even sample received in the FADC circuit to produce a second FADC decision value during the second clock period of ADC_CLK.

18. The method of claim 13, wherein the first instant in time occurs before the second instant in time occurs.

19. The method of claim 13, wherein the second instant in time occurs before the first instant in time occurs.

20. The method of claim 13, wherein the first sampler/buffer circuit comprises open loop circuitry.

21. The method of claim 13, wherein the second sampler/buffer circuit comprises open loop circuitry.

22. The method of claim 13, further comprising:

in first flip flop circuitry, receiving the CADC decision values produced by the CADC circuit and temporarily storing the CADC decision values before making the CADC decision values available to the encoder; and in second flip flop circuitry, receiving the FADC decision values produced by the FADC circuit and temporarily storing the FADC decision values before making the FADC decision values available to the encoder.

* * * * *